(12) United States Patent
Ang et al.

(10) Patent No.: US 6,828,082 B2
(45) Date of Patent: Dec. 7, 2004

(54) METHOD TO PATTERN SMALL FEATURES BY USING A RE-FLOWABLE HARD MASK

(75) Inventors: Chew-Hoe Ang, Singapore (SG); Eng Hua Lim, Singapore (SG); Randall Cha, Singapore (SG); Jia-Zhen Zheng, Singapore (SG); Elgin Quek, Singapore (SG); Mei-Sheng Zhou, Singapore (SG); Daniel Yen, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 350 days.

(21) Appl. No.: 10/072,102

(22) Filed: Feb. 8, 2002

(65) Prior Publication Data

US 2003/0152871 A1 Aug. 14, 2003

(51) Int. Cl.⁷ ................................................. G03F 7/00
(52) U.S. Cl. ......................... 430/313; 430/330; 216/51
(58) Field of Search ............................... 430/311, 313, 430/328, 329, 330; 216/41, 51

(56) References Cited

U.S. PATENT DOCUMENTS

| | | | |
|---|---|---|---|
| 4,022,932 A | 5/1977 | Feng | 427/93 |
| 4,256,514 A * | 3/1981 | Pogge | 438/361 |
| 4,449,287 A | 5/1984 | Maas et al. | 29/580 |
| 4,546,066 A | 10/1985 | Field et al. | 430/314 |
| 4,707,218 A * | 11/1987 | Giammarco et al. | 438/421 |
| 4,824,747 A | 4/1989 | Andrews | 430/1 |
| 5,899,746 A | 5/1999 | Mukai | 438/700 |

* cited by examiner

Primary Examiner—Kathleen Duda
(74) Attorney, Agent, or Firm—George O. Saile; Rosemary L. S. Pike; Stephen G. Stanton

(57) ABSTRACT

A method of forming small features, comprising the following steps. A substrate having a dielectric layer formed thereover is provided. A spacing layer is formed over the dielectric layer. The spacing layer has a thickness equal to the thickness of the small feature to be formed. A patterned, re-flowable masking layer is formed over the spacing layer. The masking layer having a first opening with a width "L". The patterned, re-flowable masking layer is re-flowed to form a patterned, re-flowed masking layer having a re-flowed first opening with a lower width "l". The re-flowed first opening lower width "l" being less than the pre-reflowed first opening width "L". The spacing layer is etched down to the dielectric layer using the patterned, re-flowed masking layer as a mask to form a second opening within the etched spacing layer having a width equal to the re-flowed first opening lower width "l". Removing the patterned, re-flowed masking layer. A small feature material is then formed within the second opening and any excess small feature material above the etched spacing layer is removed. The etched spacing layer is removed to form the small feature comprised of the small feature material.

51 Claims, 2 Drawing Sheets

METHOD TO PATTERN SMALL FEATURES BY USING A RE-FLOWABLE HARD MASK

FIELD OF THE INVENTION

The present invention relates generally to fabrication of semiconductor devices, and more specifically to methods of patterning small features used in the fabrication of semiconductor devices.

BACKGROUND OF THE INVENTION

Current practices for patterning small features typically involve using smaller wavelengths of light to pattern photoresist, or using an ashing process to reduce the dimensions of photoresist after some larger-dimension features are patterned.

U.S. Pat. No. 4,022,932 to Feng describes a resist reflow method for making submicron patterned resist masks.

U.S. Pat. No. 5,899,746 to Mukai describes a method for making small patterns by eroding a photoresist pattern.

U.S. Pat. No. 4,824,747 to Andrews describes a method for forming a variable width channel.

U.S. Pat. No. 4,449,287 to Maas et al. describes a method of providing a narrow groove or slot in a substrate region.

U.S. Pat. No. 4,546,066 to Field et al. describes a method for forming narrow images on semiconductor substrates.

SUMMARY OF THE INVENTION

Accordingly, it is an object of the present invention to provide an improved method of patterning small features.

Another object of the present invention to provide an improved method of patterning small features that does not place more stringent requirements upon lithography.

Other objects will appear hereinafter.

It has now been discovered that the above and other objects of the present invention may be accomplished in the following manner. Specifically, a substrate having a dielectric layer formed thereover is provided. A spacing layer is formed over the dielectric layer. The spacing layer has a thickness equal to the thickness of the small feature to be formed. A patterned, re-flowable masking layer is formed over the spacing layer. The masking layer having a first opening with a width "L". The patterned, re-flowable masking layer is re-flowed to form a patterned, re-flowed masking layer having a re-flowed first opening with a lower width "1". The re-flowed first opening lower width "1" being less than the pre-reflowed first opening width "L". The spacing layer is etched down to the dielectric layer using the patterned, re-flowed masking layer as a mask to form a second opening within the etched spacing layer having a width equal to the re-flowed first opening lower width "1". Removing the patterned, re-flowed masking layer. A small feature material is formed within the second opening. Any excess small feature material above the etched spacing layer is removed. The etched spacing layer is removed to form the small feature comprised of the small feature material.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Unless otherwise specified, all structures, layers, etc. may be formed or accomplished by conventional methods known in the prior art.

Initial Structure

The present invention discloses a method of patterning small features through the use of a re-flowable masking layer (16). The example illustrated herein describes forming a small gate feature/structure although one skilled in the art would recognize that other small features may be fabricated according to the teachings of the present invention.

Figure 1:
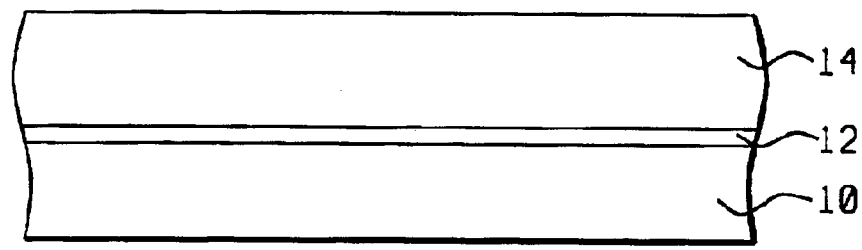
FIGS. 1 to 5 schematically illustrate in cross-sectional representation a preferred embodiment of the present invention.

FIG. 1 illustrates a cross-sectional view of a substrate 10, preferably a semiconductor substrate comprised of silicon (Si) or silicon germanium (SiGe) and is more preferably comprised of silicon.

A thin dielectric layer 12 is formed over substrate 10 to a thickness of preferably from about 15 to 100 Å and more preferably from about 20 to 50 Å. Dielectric layer 12 is preferably a grown or deposited oxide layer. For example, a silicon substrate 10 would have a silicon oxide layer 12 formed thereover.

Spacing layer 14 is formed over dielectric layer 12 to a thickness equal to the desired thickness of the final gate (in this illustrated example) to be formed. Spacing layer 14 is preferably comprised of silicon nitride ($Si_3N_4$) or silicon oxynitride (SiON) and is more preferably silicon nitride.

Formation of Re-flowable Patterned Masking Layer 16

Figure 2:
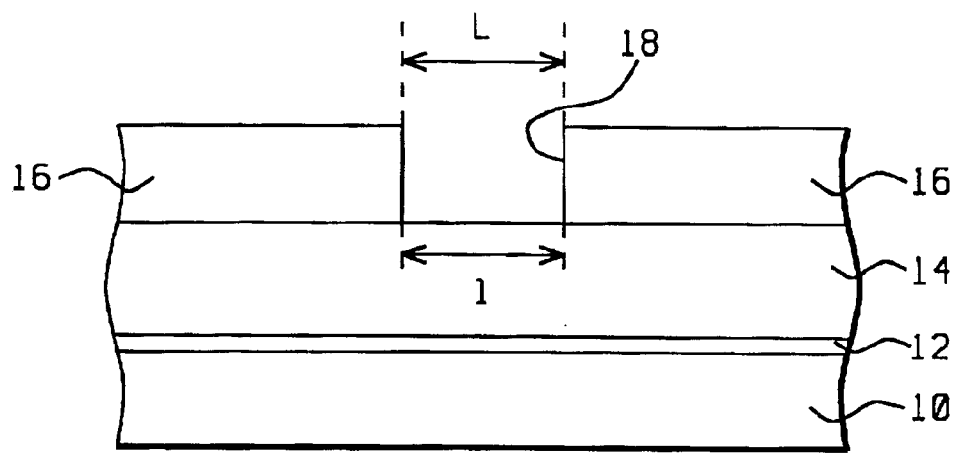

As shown in FIG. 2, a patterned, re-flowable masking layer 16 is formed over nitride spacing layer 14 to a thickness of preferably from about 400 to 2000 Å and more preferably from about 1000 to 1500 Å. Re-flowable masking layer 16 is preferably formed of a doped oxide.

Patterned dope oxide layer 16 has first opening 18 having a width L. In forming a gate feature/structure, width "L" may be as narrow as from about 1000 to 1800 Å. In general, it is possible to form a patterned re-flowable masking layer with a first opening 18 having a width "L" as narrow as from about 1200 to 1500.

Re-flowing Patterned Masking Layer 16

Figure 3:
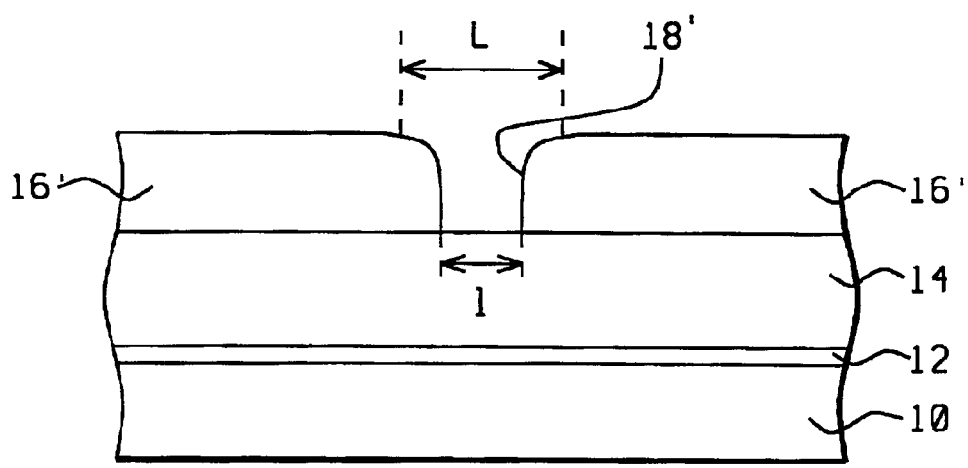

As shown in FIG. 3, re-flowable patterned masking layer 16 is subjected to a thermal cycle that causes it to re-flow to form re-flowed patterned masking layer 16' with a re-flowed first opening 18' having a lower width "1" that is significantly less than the initial width "L" before the thermal re-flowing process. In forming a gate feature/structure, re-flowed lower width "1" may be a narrow as from about 200 to 800 Å. In general, it is possible to form a patterned re-flowed masking layer with a re-flowed opening 18 having a lower width "1" as narrow as from about 250 to 800 Å. The thermal cycle has a temperature of preferably from about 850 to 950° C. for preferably from about 900 to 1800 seconds.

Etching of Spacing Layer 14/Formation of Gate Material Layer 24

Figure 4:
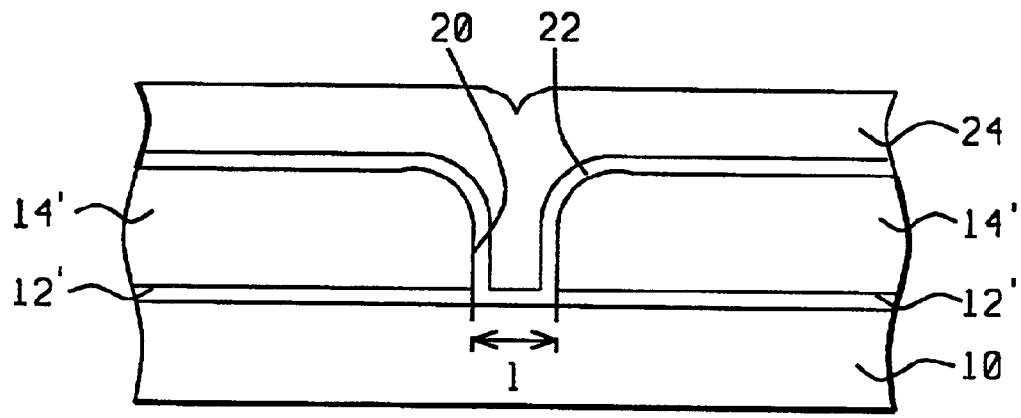

As shown in FIG. 4, nitride spacing layer 14 is etched to form second opening 20, stopping on the dielectric layer 12, using re-flowed patterned masking layer 16' as a mask. Second opening 20 has a width equal to the lower width "1" of re-flowed patterned masking layer 16'.

Re-flowed patterned masking layer 16' is then removed and any residual dielectric layer 12 within second opening 20 is removed and, in forming a gate feature/structure, a gate dielectric layer 22 is formed within second opening Gate dielectric layer 22 is preferably grown and/or deposited and is preferably formed of silicon oxide nitrided silicon oxide, a silicon oxide/nitride stack or a high-k dielectric material such as aluminum oxide and is preferably formed of a silicon oxide/nitride stack. Gate dielectric layer 22 has an equivalent oxide thickness (EOT) of preferably from about 7 to 20 Å and more preferably from about 10 to 16 Å. EOT is extracted from electrical measurements followed by simulations. The EOT of a $SiO_2/Si_3N_4$ stack will be less than its physical thickness, but would be the thickness of its silicon oxide electrical equivalent.

Gate material layer 24 is then formed over gate dielectric layer 22, filling second opening 20. Gate material layer 24 is preferably comprised of polysilicon, polysilicon germanium (poly SiGe), titanium, molybdenum, nickel or stacks comprised of the above and is more preferably comprised of polysilicon.

Formation of Gate Electrode 26

Figure 5:
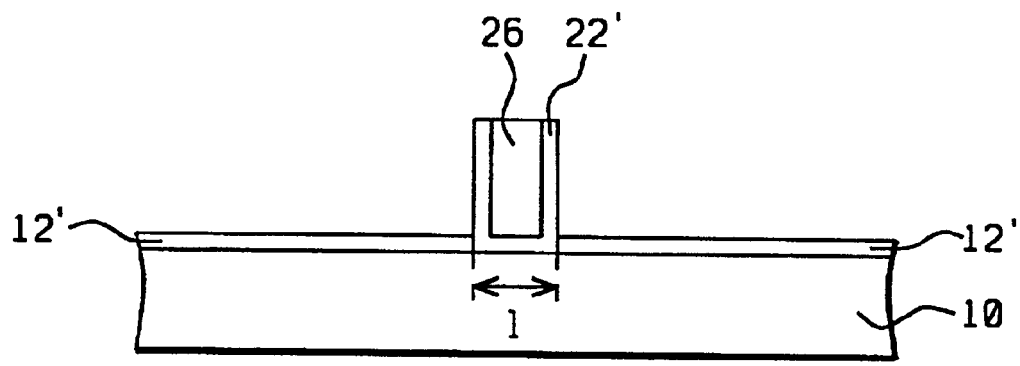

As shown in FIG. 5, excess gate material layer 24 and gate dielectric layer 22 are removed, preferably by planarization and more preferably by chemical mechanical polishing, down to spacing layer 14.

Spacing layer 14 is then removed, preferably by a stripping process, leaving gate electrode 26 with gate dielectric layer 22' on its sides and bottom.

Conventional processing may then proceed.

Advantages of the Invention

The advantages of the present invention include:

1) reduced lithography requirements; and
2) reduced etch (line roughness) requirements.

While particular embodiments of the present invention have been illustrated and described, it is not intended to limit the invention, except as defined by the following claims.

We claim:

1. A method of forming small features, comprising the steps of:

providing a substrate having a dielectric layer formed thereover;

forming a spacing layer over the dielectric layer; the spacing layer having a thickness equal to the thickness of the small feature to be formed;

forming a patterned, re-flowable masking layer over the spacing layer; the masking layer having a first opening with a width "L"; wherein the re-flowable masking layer is comprised of an oxide;

re-flowing the patterned, re-flowable masking layer to form a patterned, re-flowed masking layer having a re-flowed first opening with a lower width "l"; the re-flowed first opening lower width "l"being less than the pre-re-flowed first opening width "L";

etching the spacing layer to the dielectric layer using the patterned, re-flowed masking layer as a mask to form a second opening within the etched spacing layer having a width equal to the re-flowed first opening lower width "l";

removing the patterned, re-flowed masking layer;

forming a small feature material within the second opening;

removing any excess small feature material above the etched spacing layer; and removing the etched spacing layer to form the small feature comprised of the small feature material.

2. The method of claim 1, wherein the substrate is formed of a material selected from the group consisting of silicon and silicon germanium; the dielectric layer is formed of a material selected from the group consisting of grown silicon oxide and deposited silicon oxide; the spacing layer is formed of a material selected from the group consisting of silicon nitride and silicon oxynitride; the masking layer is formed of doped oxide; and the small feature material is formed of a material selected from the group consisting of polysilicon, polysilicon germanium (poly SiGe), titanium, molybdenum, nickel and stacks comprised of the above materials.

3. The method of claim 1, wherein the substrate is formed of silicon; the dielectric layer is formed of silicon oxide; the spacing layer is formed of silicon nitride; the masking layer is formed of a doped oxide; and the small feature material is formed of polysilicon.

4. The method of claim 1, wherein the pre-re-flowed first opening width "L" has a width of from about 1000 to 1800 Å and the re-flowed first opening lower width "l" has a width of from about 200 to 800 Å.

5. The method of claim 1, wherein the pre-re-flowed first opening width "L" has a width of from about 1200 to 1500 Å and the re-flowed first opening lower width "l" has a width of from about 250 to 800 Å.

6. The method of claim 1, wherein the dielectric layer is from about 15 to 100 Å thick; and the masking layer is from about 400 to 2000 Å thick.

7. The method of claim 1, wherein the dielectric layer is from about 20 to 50 Å thick; and the masking layer is from about 1000 to 1500 Å thick.

8. The method of claim 1, including the step of forming a gate dielectric layer liner within the second opening.

9. The method of claim 1, including the step of forming a gate dielectric layer liner within the second opening; the gate dielectric layer being formed of a material selected from the group consisting of silicon oxide, nitrided silicon oxide, a silicon oxide/nitride stack and a high-k dielectric material such as aluminum oxide.

10. The method of claim 1, including the step of forming a gate dielectric layer liner within the second opening; the gate dielectric layer liner having an equivalent oxide thickness (EOT) thickness of from about 7 to 20 Å.

11. The method of claim 1, including the step of forming a gate dielectric layer liner within the second opening; the gate dielectric layer liner having an equivalent oxide thickness (EOT) thickness of from about 10 to 16 Å.

12. The method of claim 1, wherein the patterned, re-flowable masking layer is re-flowed by a thermal cycle.

13. The method of claim 1, wherein the patterned, re-flowable masking layer is re-flowed by a thermal cycle conducted at a temperature of from about 850 to 950° C. for from about 900 to 1800 seconds.

14. A method of forming small features, comprising the steps of:

providing a substrate having a dielectric layer formed thereover;

forming a spacing layer over the dielectric layer; the spacing layer having a thickness equal to the thickness of the small feature to be formed;

forming a patterned, re-flowable masking layer over the spacing layer; the masking layer having a first opening with a width "L" of from about 1000 to 1800 Å;

re-flowing the patterned, re-flowable masking layer to form a patterned, re-flowed masking layer having a re-flowed first opening with a lower width "l" of from about 200 to 800 Å;

etching the spacing layer to the dielectric layer using the patterned, re-flowed masking layer as a mask to form a second opening within the etched spacing layer having a width equal to the re-flowed first opening lower width "l";

removing the patterned, re-flowed masking layer;

forming a small feature material within the second opening;

removing any excess small feature material above the etched spacing layer; and removing the etched spacing layer to form the small feature comprised of the small feature material.

15. The method of claim 14, wherein the substrate is formed of a material selected from the group consisting of silicon and silicon germanium; the dielectric layer is formed of a material selected from the group consisting of grown silicon oxide and deposited silicon oxide; the spacing layer is formed of a material selected from the group consisting of silicon nitride and silicon oxynitride; the masking layer is formed of doped oxide; and the small feature material is formed of a material selected from the group consisting of polysilicon, polysilicon germanium (poly SiGe), titanium, molybdenum, nickel and stacks comprised of the above materials.

16. The method of claim 14, wherein the substrate is formed of silicon; the dielectric layer is formed of silicon oxide; the spacing layer is formed of silicon nitride; the masking layer is formed of a doped oxide; and the small feature material is formed of polysilicon.

17. The method of claim 14, wherein the pre-re-flowed first opening width "L" has a width of from about 1200 to 1500 Å and the re-flowed first opening lower width "1" has a width of from about 250 to 800 Å.

18. The method of claim 14, wherein the dielectric layer is from about15 to 100 Å thick; and the masking layer is from about 400 to 2000 Å thick.

19. The method of claim 14, wherein the dielectric layer is from about 20 to 50 Å thick; and the masking layer is from about 1000 to 1500 Å thick.

20. The method of claim 14, including the step of forming a gate dielectric layer liner within the second opening.

21. The method of claim 14, including the step of forming a gate dielectric layer liner within the second opening; the gate dielectric layer being formed of a material selected from the group consisting of silicon oxide, nitrided silicon oxide, a silicon oxide/nitride stack and a high-k dielectric material such as aluminum oxide.

22. The method of claim 14, including the step of forming a gate dielectric layer liner within the second opening; the gate dielectric layer liner having an EOT thickness of from about 7 to 20 Å.

23. The method of claim 14, including the step of forming a gate dielectric layer liner within the second opening the gate dielectric layer liner having an EOT thickness of from about 10 to 16 Å.

24. The method of claim 14, wherein the patterned, re-flowable masking layer is re-flowed by a thermal cycle.

25. The method of claim 14, wherein the patterned, re-flowable masking layer is re-flowed by a thermal cycle conducted at a temperature of from about 850 to 950° C. for from about 900 to 1800 seconds.

26. A method of forming small features, comprising the steps of:

providing a substrate having a dielectric layer formed thereover;

forming a spacing layer over the dielectric layer; the spacing layer having a thickness equal to the thickness of the small feature to be formed;

forming a patterned, re-flowable masking layer over the spacing layer; the masking layer having a first opening with a width "L" of from about 1000 to 1800 Å;

re-flowing the patterned, re-flowable masking layer to form a patterned, re-flowed masking layer having a re-flowed first opening with a lower width "1" of from about 200 to 800 Å;

etching the spacing layer to the dielectric layer using the patterned, re-flowed masking layer as a mask to form a second opening within the etched spacing layer having a width equal to the re-flowed first opening lower width "1";

removing the patterned, re-flowed masking layer;

forming a gate dielectric layer liner within the second opening forming a small feature material within the gate dielectric layer lined second opening;

removing any excess small feature material and gate dielectric layer liner above the etched spacing layer; and removing the etched spacing layer to form the small feature comprised of the small feature material.

27. The method of claim 26, wherein the substrate is formed of a material selected from the group consisting of silicon and silicon germanium; the dielectric layer is formed of a material selected from the group consisting of grown silicon oxide and deposited silicon oxide; the spacing layer is formed of a material selected from the group consisting of silicon nitride and silicon oxynitride; the masking layer is formed of doped oxide; and the small feature material is formed of a material selected from the group consisting of polysilicon, polysilicon germanium (poly SiGe), titanium, molybdenum, nickel and stacks comprised of the above materials.

28. The method of claim 26, wherein the substrate is formed of silicon; the dielectric layer is formed of silicon oxide; the spacing layer is formed of silicon nitride; the masking layer is formed of a doped oxide; and the small feature material is formed of polysilicon.

29. The method of claim 26, wherein the pre-re-flowed first opening width "L" has a width of from about 1200 to 1500 Å and the re-flowed first opening lower width "1" has a width of from about 250 to 800 Å.

30. The method of claim 26, wherein the dielectric layer is from about 15 to 100 Å thick; and the masking layer is from about 400 to 2000 Å thick.

31. The method of claim 26, wherein the dielectric layer is from about 20 to 50 Å thick; and the masking layer is from about 1000 to 1500 Å thick.

32. The method of claim 26, wherein the gate dielectric layer is formed of a material selected from the group consisting of silicon oxide, nitrided silicon oxide, a silicon oxide/nitride stack and a high-k dielectric material such as aluminum oxide.

33. The method of claim 26, wherein the gate dielectric layer liner has an EOT thickness of from about 7 to 20 Å.

34. The method of claim 26, wherein the gate dielectric layer liner has an EOT thickness of from about 10 to 16 Å.

35. The method of claim 26, wherein the patterned, re-flowable masking layer is re-flowed by a thermal cycle.

36. The method of claim 26, wherein the patterned, re-flowable masking layer is re-flowed by a thermal cycle conducted at a temperature of from about 850 to 950° C. for from about 900 to 1800 seconds.

37. A method of forming small features, comprising the steps of:

providing a substrate having a dielectric layer formed thereover;

forming a spacing layer over the dielectric layer;

forming a patterned, re-flowable oxide masking layer over the spacing layer; the masking layer having a first opening with a first width;

re-flowing the patterned, re-flowable oxide masking layer to form a patterned, re-flowed oxide masking layer having a re-flowed first opening with a lower width; the re-flowed first opening lower width being less than the first width of the pre-re-flowed first opening;

etching the spacing layer to the dielectric layer using the patterned, re-flowed oxide masking layer as a mask to form a second opening within the etched spacing layer having a width equal to the re-flowed first opening lower width;

removing the patterned, re-flowed oxide masking layer; and forming a small feature material within the second opening.

38. The method of claim 37, wherein the spacing layer has a thickness equal to the thickness of the small feature to be formed.

39. The method of claim 37, including the further steps of:

removing any excess small feature material above the etched spacing layer; and removing the etched spacing layer to form the small feature comprised of the small feature material.

40. The method of claim 37, wherein the substrate is formed of a material selected from the group consisting of silicon and silicon germanium; the dielectric layer is formed of a material selected from the group consisting of grown silicon oxide and deposited silicon oxide; the spacing layer is formed of a material selected from the group consisting of silicon nitride and silicon oxynitride; the oxide masking layer is formed of doped oxide; and the small feature material is formed of a material selected from the group consisting of polysilicon, polysilicon germanium (poly SiGe), titanium, molybdenum, nickel and stacks comprised of the above materials.

41. The method of claim 37, wherein the substrate is formed of silicon; the dielectric layer is formed of silicon oxide; the spacing layer is formed of silicon nitride; the oxide masking layer is formed of a doped oxide; and the small feature material is formed of polysilicon.

42. The method of claim 37, wherein the pre-re-flowed first opening first width has a width of from about 1000 to 1800 Å and the re-flowed first opening lower width has a width of from about 200 to 800 Å.

43. The method of claim 37, wherein the pre-re-flowed first opening first width has a width of from about 1200 to 1500 Å and the re-flowed first opening lower width has a width of from about 250 to 800 Å.

44. The method of claim 37, wherein the dielectric layer is from about 15 to 100 Å thick; and the masking layer is from about 400 to 2000 Å thick.

45. The method of claim 37, wherein the dielectric layer is from about 20 to 50 Å thick; and the masking layer is from about 1000 to 1500 Å thick.

46. The method of claim 37, including the step of forming a gate dielectric layer liner within the second opening.

47. The method of claim 37, including the step of forming a gate dielectric layer liner within the second opening; the gate dielectric layer being formed of a material selected from the group consisting of silicon oxide, nitrided silicon oxide, a silicon oxide/nitride stack and a high-k dielectric material such as aluminum oxide.

48. The method of claim 37, including the step of forming a gate dielectric layer liner within the second opening; the gate dielectric layer liner having an equivalent oxide thickness (EOT) thickness of from about 7 to 20 Å.

49. The method of claim 37, including the step of forming a gate dielectric layer liner within the second opening; the gate dielectric layer liner having an equivalent oxide thickness (EOT) thickness of from about 10 to 16 Å.

50. The method of claim 37, wherein the patterned, re-flowable masking layer is re-flowed by a thermal cycle.

51. The method of claim 37, wherein the patterned, re-flowable masking layer is re-flowed by a thermal cycle conducted at a temperature of from about 850 to 950° C. for from about 900 to 1800 seconds.

* * * * *